United States Patent
Jiang

(10) Patent No.: US 9,741,750 B2
(45) Date of Patent: Aug. 22, 2017

(54) THIN FILM TRANSISTOR, PIXEL STRUCTURE, AND METHOD FOR MANUFACTURING THE SAME, ARRAY SUBSTRATE AND DISPLAY DEVICE

(71) Applicant: BOE TECHNOLOGY GROUP CO., LTD., Beijing (CN)

(72) Inventor: Chunsheng Jiang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/120,736

(22) PCT Filed: Sep. 8, 2015

(86) PCT No.: PCT/CN2015/089139
§ 371 (c)(1),
(2) Date: Aug. 22, 2016

(87) PCT Pub. No.: WO2016/123974
PCT Pub. Date: Aug. 11, 2016

(65) Prior Publication Data
US 2016/0365361 A1    Dec. 15, 2016

(30) Foreign Application Priority Data
Feb. 4, 2015 (CN) .......................... 2015 1 0059734

(51) Int. Cl.
*H01L 27/12* (2006.01)
*H01L 21/77* (2017.01)
(Continued)

(52) U.S. Cl.
CPC ...... *H01L 27/127* (2013.01); *H01L 21/02178* (2013.01); *H01L 21/02321* (2013.01);
(Continued)

(58) Field of Classification Search
None
See application file for complete search history.

(56) References Cited

U.S. PATENT DOCUMENTS

2011/0097842 A1    4/2011   Yang et al.
2016/0359047 A1*  12/2016   Shi .................... H01L 29/786

FOREIGN PATENT DOCUMENTS

CN    103107202 A    5/2013
CN    103715196 A    4/2014
(Continued)

OTHER PUBLICATIONS

First Chinese Office Action, for Chinese Patent Application No. 201510059734.1, dated Jan. 26, 2017, 7 pages.
(Continued)

*Primary Examiner* — Benjamin Sandvik
(74) *Attorney, Agent, or Firm* — Kinney & Lange, P.A.

(57) ABSTRACT

A thin film transistor, a pixel structure, an array substrate, a display device, a method for manufacturing a thin film transistor, and a method for manufacturing a pixel structure are disclosed. The thin film transistor includes a gate electrode, a source electrode and a drain electrode, wherein a first passivation layer made from an aluminum oxide material is provided on the source electrode and the drain electrode, and an active layer made from an aluminum oxide material doped with ions is provided in a region of the first passivation layer corresponding to the gate electrode. Since the first passivation layer as insulation material is doped with the ions to form an active layer, the etching stop layer may be omitted, thereby simplifying the structure of the thin film transistor.

20 Claims, 7 Drawing Sheets

(51) Int. Cl.
*H01L 29/786* (2006.01)
*H01L 21/02* (2006.01)
*H01L 21/426* (2006.01)
*H01L 29/66* (2006.01)

(52) U.S. Cl.
CPC ...... *H01L 21/02612* (2013.01); *H01L 21/426* (2013.01); *H01L 21/77* (2013.01); *H01L 27/12* (2013.01); *H01L 27/1225* (2013.01); *H01L 27/1248* (2013.01); *H01L 27/1288* (2013.01); *H01L 29/66969* (2013.01); *H01L 29/786* (2013.01); *H01L 29/7869* (2013.01); *H01L 29/78696* (2013.01)

(56) References Cited

FOREIGN PATENT DOCUMENTS

| CN | 103715267 A | 4/2014 |
| CN | 103730346 A | 4/2014 |
| CN | 104638017 A | 5/2015 |
| JP | 2003203925 A | 7/2003 |

OTHER PUBLICATIONS

International Search Report and Written Opinion (including English translation of Box V) dated Dec. 16, 2016, for corresponding PCT Application No. PCT/CN2015/089139.

* cited by examiner

US 9,741,750 B2

THIN FILM TRANSISTOR, PIXEL STRUCTURE, AND METHOD FOR MANUFACTURING THE SAME, ARRAY SUBSTRATE AND DISPLAY DEVICE

CROSS-REFERENCE TO RELATED APPLICATION

This application is a Section 371 National Stage Application of International Application No. PCT/CN2015/089139, filed on Sep. 8, 2015, entitled "THIN FILM TRANSISTOR, PIXEL STRUCTURE, AND METHOD FOR MANUFACTURING THE SAME, ARRAY SUBSTRATE AND DISPLAY DEVICE", which claims priority to Chinese Application No. 201510059734.1, filed on Feb. 4, 2015, incorporated herein by reference in their entirety.

BACKGROUND OF THE INVENTION

Field of the Invention

Embodiments of the present disclosure relate to a display device, and more particularly, to a thin film transistor, a pixel structure, an array substrate, a method for manufacturing a thin film transistor, and a method for manufacturing a pixel structure.

Description of the Related Art

A thin film transistor (TFT) is used as a switching element in a flat panel display device, such as a liquid crystal display (LCD), an organic light emitting diode (OLED) display, and an active matrix organic light emitting diode (AMOLED) display. For example, in a conventional LCD, a channel layer of the TFT is mainly formed of an amorphous silicon layer, which has a relatively low migration rate. As the display becomes larger, it presents higher and higher requirements for resolution and high-frequency driving performance of the display, thus, it is necessary to increase the migration rate of the channel layer of the TFT.

At present, a metal oxide, such as an In—Ga—Zn—O (IGZO) film, has been developed to function as an active layer of the TFT. Since the migration rate of the metal oxide is dozens of times higher than the migration rate of the amorphous silicon layer and has excellent semiconductor characteristics, the metal oxide may greatly increase charging/discharging speed of the TFT to a pixel electrode, increase response speed of a pixel, achieve a higher refresh rate, and significantly increase a line scanning rate of the pixel.

The thin film transistor having the active layer formed from the IGZO typically has an etching stop layer, that is, it is necessary to deposit an insulation layer on the active layer after the active layer has been formed from the IGZO, so as to protect a metal oxide IGZO layer from being damaged in subsequent processes of etching a source metal electrode and an drain metal electrode, thus, to improve the performance of the TFT having the metal oxide IGZO layer. Therefore, it requires one additional lithographic process to form the etching stop layer, thereby increasing the number of manufacturing steps of the TFT.

SUMMARY OF THE INVENTION

The embodiments of the present disclosure aim to provide a thin film transistor, a pixel structure, an array substrate, a display device, a method for manufacturing a thin film transistor, and a method for manufacturing a pixel structure, so as to simplify the manufacturing process of the thin film transistor, improve the performance of the thin film transistor and reduce the size of channel regions thereof.

According to an aspect of the present disclosure, there is provided a thin film transistor, comprising a gate electrode, a source electrode and a drain electrode, wherein a first passivation layer made from an aluminum oxide material is provided on the source electrode and the drain electrode, and an active layer made from an aluminum oxide material doped with ions is provided in a region of the first passivation layer corresponding to the gate electrode.

According to a thin film transistor in accordance with an embodiment of the present disclosure, the ions comprise gallium ions and tin ions so that the doped aluminum oxide material forms an aluminum-gallium-tin oxide.

According to a thin film transistor in accordance with an embodiment of the present disclosure, the thin film transistor is a bottom gate thin film transistor, and two sides of the active layer cover edges of respective sides of the source electrode and the drain electrode away from the gate electrode, respectively.

According to a thin film transistor in accordance with an embodiment of the present disclosure, a second passivation layer is provided on the first passivation layer.

According to another aspect of the present disclosure, there is provided a pixel structure, comprising: a substrate; a driving thin film transistor provided on the substrate, the driving thin film transistor being the thin film transistor according to any one of the embodiments described above; and a switching thin film transistor provided on the substrate, the switching thin film transistor being the thin film transistor according to any one of the embodiments described above, wherein the drain electrode of the switching thin film transistor is electrically connected to the gate electrode of the driving thin film transistor.

According to a pixel structure in accordance with an embodiment of the present disclosure, the source electrode and the drain electrode of the switching thin film transistor and the source electrode and the drain electrode of the driving thin film transistor are made of the same material and provided in the same layer.

According to a pixel structure in accordance with an embodiment of the present disclosure, a second passivation layer is provided on the first passivation layer.

According to a pixel structure in accordance with an embodiment of the present disclosure, it further comprises a pixel electrode electrically connected to the drain electrode of the driving thin film transistor through a via hole formed in the first passivation layer and the second passivation layer.

According to a further another aspect of the present disclosure, there is provided an array substrate, comprising a plurality of pixel structures according to any one of the embodiments described above.

According to a still another aspect of the present disclosure, there is provided a display device, comprising the array substrate according to the above embodiment.

According to a further aspect of the present disclosure, there is provided a method for manufacturing a thin film transistor, comprising a step of forming a thin film transistor on a substrate, wherein the step of forming the thin film transistor on the substrate comprises steps of: forming a first passivation layer from an aluminum oxide material on a source electrode and a drain electrode of the thin film transistor; and forming an active layer by doping with ions on a region of the first passivation layer corresponding to a gate electrode of the thin film transistor.

According to a method in accordance with an embodiment of the present disclosure, the ions comprise gallium ions and tin ions so that the doped aluminum oxide material forms an aluminum-gallium-tin oxide (AGTO).

According to a method in accordance with an embodiment of the present disclosure, the step of forming the thin film transistor on the substrate further comprises steps of: forming the gate electrode on the substrate; forming a gate insulation layer on the substrate formed with the gate electrode; and forming the source electrode and the drain electrode on the gate insulation layer.

According to a method in accordance with an embodiment of the present disclosure, the step of forming the active layer by doping with the ions on the region of the first passivation layer corresponding to the gate electrode of the thin film transistor comprises steps of: forming a second passivation layer on the first passivation layer; and implanting gallium ions and tin ions into the region of the first passivation layer corresponding to the gate electrode through the second passivation layer.

According to a method in accordance with an embodiment of the present disclosure, the step of forming the active layer by doping with the ions on the region of the first passivation layer corresponding to the gate electrode of the thin film transistor further comprises a step of: forming a photoresist layer on the second passivation layer, so as to implant the gallium ions and the tin ions through the photoresist layer and the second passivation layer.

According to a method in accordance with an embodiment of the present disclosure, two sides of the active layer are formed to cover edges of respective sides of the source electrode and the drain electrode away from the gate electrode, respectively.

According to a further aspect of the present disclosure, there is provided a method for manufacturing a pixel structure, comprising a step of forming a switching thin film transistor and a driving thin film transistor on a substrate, wherein the step of forming the switching thin film transistor and the driving thin film transistor on the substrate comprises steps of:

forming a first passivation layer from an aluminum oxide material on source electrodes and drain electrodes of the switching thin film transistor and the driving thin film transistor; and forming active layers of the switching thin film transistor and the driving thin film transistor by doping with ions on regions of the first passivation layer corresponding to respective gate electrodes of the switching thin film transistor and the driving thin film transistor, respectively.

According to a method in accordance with an embodiment of the present disclosure, the step of forming the switching thin film transistor and the driving thin film transistor on the substrate further comprises steps of:

forming the gate electrodes of the switching thin film transistor and the driving thin film transistor on the substrate;

forming a gate insulation layer on the substrate formed with the gate electrodes, and forming a first via hole in a position of the gate insulation layer corresponding to the gate electrode of the driving thin film transistor;

forming an electrically conductive layer on the gate insulation layer; and forming the source electrodes and the drain electrodes of the switching thin film transistor and the driving thin film transistor by means of the electrically conductive layer by a patterning process, respectively, wherein the drain electrode of the switching thin film transistor is electrically connected to the gate electrode of the driving thin film transistor through the first via hole.

According to a method in accordance with an embodiment of the present disclosure, the step of forming the active layers of the switching thin film transistor and the driving thin film transistor by doping with the ions on the regions of the first passivation layer corresponding to the respective gate electrodes of the switching thin film transistor and the driving thin film transistor respectively comprises steps of:

forming a second passivation layer on the first passivation layer; and implanting gallium ions and tin ions into the regions of the first passivation layer corresponding to the respective gate electrodes of the switching thin film transistor and the driving thin film transistor through the second passivation layer, respectively.

According to a method in accordance with an embodiment of the present disclosure, the step of forming the active layers of the switching thin film transistor and the driving thin film transistor by doping with the ions on the regions of the first passivation layer corresponding to the respective gate electrodes of the switching thin film transistor and the driving thin film transistor respectively further comprises steps of:

forming a photoresist layer on the second passivation layer;

partially exposing regions of the photoresist layer corresponding to the respective gate electrodes of the switching thin film transistor and the driving thin film transistor by using a half-tone mask or a gray-tone mask, and fully exposing a region of the photoresist layer corresponding to the drain electrode of the driving thin film transistor;

forming a second via hole by etching in a portion of the photoresist layer where the photoresist has been completely removed, the second via hole being configured to reach the drain electrode of the driving thin film transistor;

implanting the gallium ions and the tin ions in the regions of the first passivation layer corresponding to the respective gate electrodes of the switching thin film transistor and the driving thin film transistor through the photoresist layer and the second passivation layer;

stripping the remaining photoresist; and forming a pixel electrode on the second passivation layer, the pixel electrode being electrically connected to the drain electrode of the driving thin film transistor through the second via hole.

According to a method in accordance with an embodiment of the present disclosure, two sides of each active layer are formed to cover edges of respective sides of the source electrode and the drain electrode away from the corresponding gate electrode, respectively.

According to a method in accordance with an embodiment of the present disclosure, the ions comprise gallium ions and tin ions so that the doped aluminum oxide material forms an aluminum-gallium-tin oxide.

According to the thin film transistor, the pixel structure, the array substrate, the display device, the method for manufacturing the array substrate in accordance with the above-described embodiments of the present disclosure, since the first passivation layer as insulation material is doped with the ions to form an active layer, the manufacturing process of the thin film transistor is simplified, the etching stop layer may be omitted, thereby simplifying the structure of the thin film transistor.

BRIEF DESCRIPTION OF THE DRAWINGS

In order to clearly understand objectives, technical solutions, and advantages of the present disclosure, the present disclosure will be further described in detail in conjunction with the specific embodiments, as well as the accompanying drawings, in which.

DETAILED DESCRIPTION OF PREFERRED EMBODIMENTS OF THE INVENTION

Figure 1:
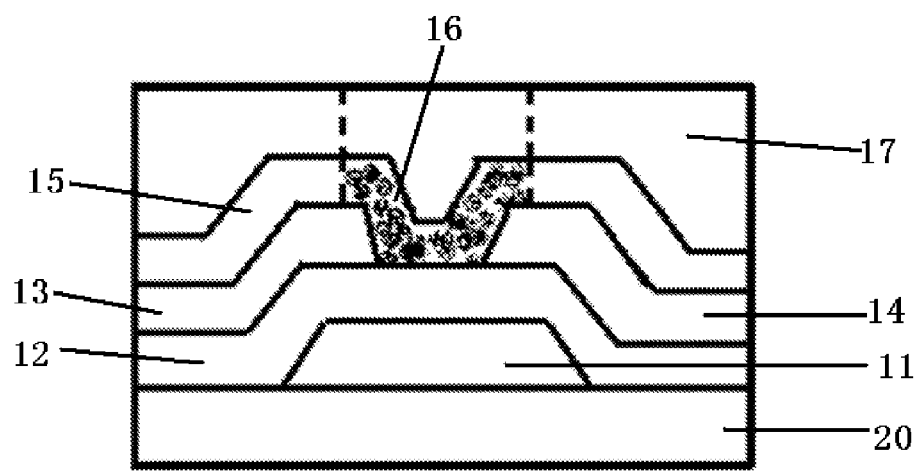
FIG. 1 is a cross sectional view of a thin film transistor according to an exemplary embodiment of the present disclosure.

The technical solutions of the present disclosure will be further described in detail below with reference to the embodiments in combination with the accompanying drawings. In the specification, the same or similar reference numerals refer to the same or similar components. The following description of the embodiments of the present disclosure with reference to the accompanying drawings is intended to explain the general inventive concept of the present disclosure, but not limit the present disclosure.

According to a general concept of the present disclosure, there is provided a thin film transistor, comprising a gate electrode, a source electrode and a drain electrode, wherein a first passivation layer made from an aluminum oxide material is provided on the source electrode and the drain electrode, and an active layer made from an aluminum oxide material doped with ions is provided in a region of the first passivation layer corresponding to the gate electrode. The ions comprise gallium ions and tin ions so that the doped aluminum oxide material forms an aluminum-gallium-tin oxide. Since the first passivation layer as insulation material is doped with the ions to form an active layer, the manufacturing process of the thin film transistor (TFT) is simplified, an etching stop layer (ESL) may be omitted, thereby simplifying the structure of the thin film transistor.

In the following detailed description, for ease of explanations, lots of specific details are illustrated in order to provide a full understanding on embodiments of the present disclosure. However, obviously, one or more embodiments without these specific details may also be implemented. In other cases, known structures and devices are schematically embodied so as to simplify the accompanying drawings.

FIG. 1 is a cross sectional view of a thin film transistor according to an exemplary embodiment of the present disclosure. As shown in FIG. 1, the thin film transistor according to the embodiment of the present disclosure comprises a gate electrode 11, a source electrode 13 and a drain electrode 14, a first passivation layer 15 made from an aluminum oxide material is provided on the source electrode 13 and the drain electrode 14, and an active layer 16 made from an aluminum-gallium-tin oxide is provided in a region of the first passivation layer 15 corresponding to the gate electrode 11. The active layer 16 is formed by doping the first passivation layer 15 with gallium ions and tin ions in a region of the first passivation layer 15 corresponding to the gate electrode 11, while the other region of the first passivation layer 15 where no ion doping is performed still plays a role of insulation. Since the first passivation layer as insulation material is doped with the ions to form a semiconductor metal oxide layer, which functions as the active layer 16, the manufacturing process of the thin film transistor (TFT) is simplified, the etching stop layer (ESL) may be omitted, thereby simplifying the structure of the thin film transistor.

In an exemplary embodiment, as shown in FIG. 1, the gate electrode 11 is provided on the substrate 20, which is for example made of glass, transparent resin or quartz material. A gate insulation layer 12 is further provided on the substrate 20 for covering the gate electrode 11. The gate insulation layer 12 may be formed from an oxide, nitride or oxynitride, for example, $SiO_2$ or $SiN_x$. The source electrode 13 and the drain electrode 14 are provided on the gate insulation layer 12. The source electrode 13 and the drain electrode 14 may be made from a metal, such as Cu, Cr, W, Ti, Ta, Mo, Al or the like, or an alloy thereof.

According to an embodiment of the present disclosure, the thin film transistor is a bottom gate thin film transistor, that is, the gate electrode 11 is closer to the substrate 20 relative to the source electrode 13 and the drain electrode 14. Since the active layer 16 is formed by doping the first passivation layer 15 with gallium ions and tin ions in a region of the first passivation layer 15 corresponding to the gate electrode 11, two sides of the active layer 16 cover edges of respective sides of the source electrode 13 and the drain electrode 14 away from the gate electrode 11, respectively. In other words, a portion of the active layer is provided on an upper portion of the source electrode 13 and the drain electrode 14. Thus, during the manufacturing process of the thin film transistor, the process for manufacturing the source electrode 13 and the drain electrode 14 is performed before the process for manufacturing the active layer 16, so that the active layer 16 is not adversely affected due to the patterning process for forming the source electrode 13 and the drain electrode 14. As a result, there is no need to provide an etching stop layer between the active layer 16 and the source electrode and the drain electrode, thereby the structure and the manufacturing process of the thin film transistor are simplified.

According to an embodiment of the present disclosure, a second passivation layer 17 is provided on the first passivation layer 15. The first passivation layer 15 is doped with the ions through the second passivation layer 17, thus the second passivation layer 17 may serve to play a blocking role, thereby reducing the affection of the ion doping process on the gate electrode.

The thin film transistor according to the embodiment of the present disclosure may be applied to a display device, such as a liquid crystal display (LCD), an organic light emitting diode (OLED) display, and an active matrix organic light emitting diode (AMOLED) display. Next, the organic light emitting diode (OLED) display device is taken as an example to describe an array substrate and a display device including the thin film transistor according to the embodiment of the present disclosure.

Figure 3:
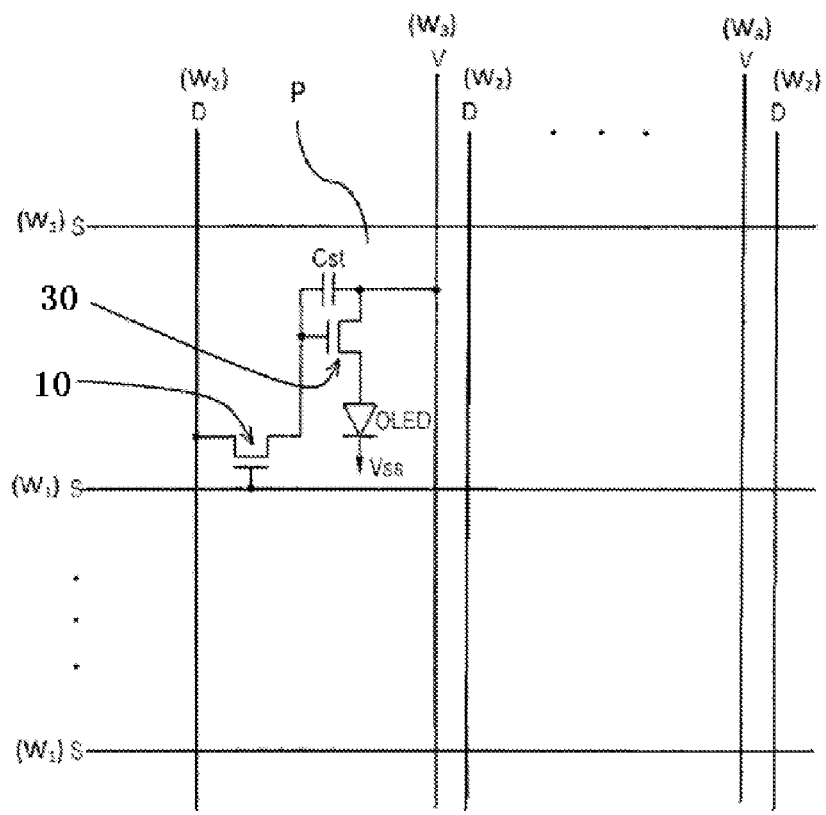
FIG. 3 is an equivalent circuit diagram of an array substrate of a display device according to an exemplary embodiment of the present disclosure.
Figure 4:
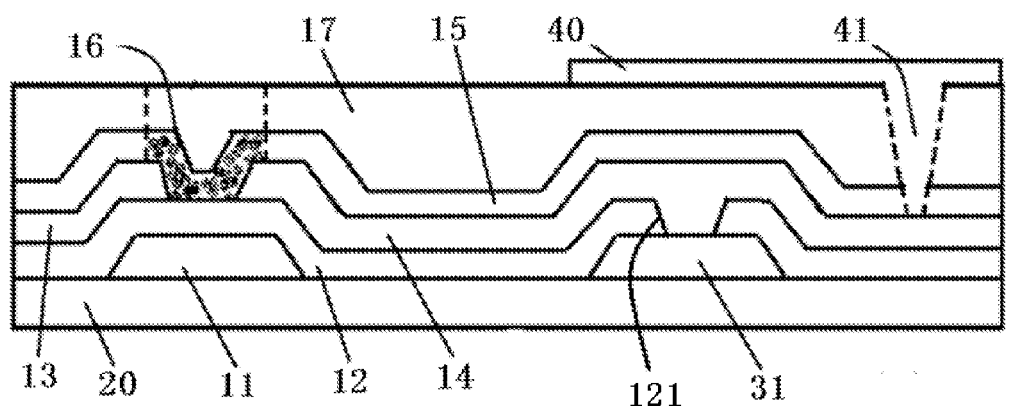
FIG. 4 is a schematic cross sectional view of one pixel structure of the array substrate shown in FIG. 3.

FIG. 3 is an equivalent circuit diagram of an array substrate of a display device according to an exemplary embodiment of the present disclosure. FIG. 4 is a schematic cross sectional view of one pixel structure of the array substrate shown in FIG. 3. As shown in FIG. 3, the array substrate comprises a plurality of pixel structures P, which are arranged in an array arrangement by means of first wires W1, second wires W2 and third wires W3. In one exemplary embodiment, the first wires W1 are formed as scanning lines S arranged in a horizontal direction for transmitting scanning signals, the second wires W2 are formed as data lines D arranged in a vertical direction for transmitting data signals, and the third wires W3 are formed as driving voltage lines V arranged in a vertical direction for transmitting driving voltages.

As shown in FIGS. 3 and 4, each pixel structure according to an exemplary embodiment of the present disclosure comprises: a substrate 20; a driving thin film transistor 30 provided on the substrate 20, the driving thin film transistor 30 being the thin film transistor according to the embodiment of the present disclosure; and a switching thin film transistor 10 provided on the substrate 20, the switching thin film transistor 10 being the thin film transistor according to the embodiment of the present disclosure, wherein a drain electrode 14 of the switching thin film transistor 10 is electrically connected to a gate electrode 31 of the driving thin film transistor 30. In addition, a storage capacitor Cst is provided between the gate electrode 31 and a source electrode of the driving thin film transistor 30, and a drain electrode of the driving thin film transistor is electrically connected to a pixel electrode 40 of an organic light emitting diode (OLED), for example, a cathode or an anode. The other end of the OLED is electrically connected to a power supply Vss.

It should be noted that, in order to clearly show an electrical connection between the drain electrode 14 of the switching thin film transistor 10 and the gate electrode 31 of the driving thin film transistor 30, the source electrode and the drain electrode of the driving thin film transistor are not illustrated in FIG. 4.

According to the pixel structure in accordance with the embodiment of the present disclosure, the active layers 16 of both the switching thin film transistor 10 and the driving thin film transistor 30 are formed by doping the first passivation layer 15 with the gallium ions and the tin ions, while the other regions of the first passivation layer 15 where no ion doping is performed still play a role of insulation. Since the first passivation layer as insulation material is doped with the ions to form the active layer, the etching stop layer for respective thin film transistors may be omitted, thereby simplifying the structure of the thin film transistors. The switching thin film transistor 10 and the driving thin film transistor 30 may be arranged in the same layer, so that the switching thin film transistor 10 and the driving thin film transistor 30 form a coplanar structure, thereby facilitating the preparation of a high-resolution display back plate.

In an embodiment, the source electrode 13 and the drain electrode 14 of the switching thin film transistor 10 and the source electrode and the drain electrode (not shown) of the driving thin film transistor 30 are made of the same material and provided in the same layer. Thus, the source electrodes and the drain electrodes of two thin film transistors may be formed by one patterning process, thereby reducing the number of the patterning processes and reducing the number of the used masks.

According to an embodiment of the present disclosure, a second passivation layer 17 is provided on the first passivation layer 15. The first passivation layer 15 is doped with the ions through the second passivation layer 17, thus the second passivation layer 17 may serve to play a blocking role, thereby reducing the affection of the ion doping process on the gate electrode.

According to an embodiment of the present disclosure, the pixel electrode 40 of the pixel structure is electrically connected to the drain electrode (not shown) of the driving thin film transistor 30 through a second via hole 41 formed in the first passivation layer 15 and the second passivation layer 17. The pixel electrode 40 may be a cathode or an anode, so as to drive a light emitting layer of an organic light emitting diode to emit light.

According to another aspect of the present disclosure, there is provided an array substrate, comprising a plurality of pixel structures according to any one of the embodiments described above. According to a further aspect of the present disclosure, there is provided a display device, comprising the array substrate according to the above embodiment. For example, the array substrate may be assembled with a color filter substrate, and liquid crystal material may be filled between the array substrate and the color filter substrate to form a liquid crystal display device. In another embodiment, the array substrate according to the embodiment of the present disclosure may be applied to an OLED display device or an AMOLED display device. Such display device may be a mobile phone, a tablet computer, a television, a display monitor, a notebook computer, a digital photo frame, a navigator, an electronic paper or any other product or component having a display function.

According to a still another aspect of the present disclosure, as shown in FIGS. 1 and 2a-2f, there is provided a method for manufacturing a thin film transistor, comprising a step of forming a thin film transistor on a substrate 20, wherein the step of forming the thin film transistor on the substrate 20 comprises steps of: forming a first passivation layer 15 from an aluminum oxide material on a source electrode 13 and a drain electrode 14 of the thin film transistor; and forming an active layer 16 by doping the first passivation layer 15 with gallium ions and tin ions in a region of the first passivation layer 15 corresponding to a gate electrode 11 of the thin film transistor. The active layer 16 is formed by doping the first passivation layer 15 with gallium ions and tin ions in a region of the first passivation layer 15 corresponding to the gate electrode 11, while the other region of the first passivation layer 15 where no ion doping is performed still plays a role of insulation. Since the first passivation layer as insulation material is doped with the ions to form a semiconductor metal oxide layer, which functions as the active layer, the manufacturing process of the thin film transistor is simplified, the etching stop layer may be omitted, thereby simplifying the structure of the thin film transistor.

Figure 2A:
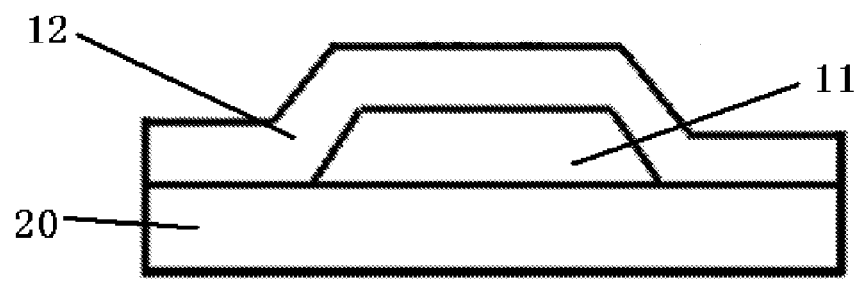
FIGS. 2a-2f are schematic views showing various operating processes for manufacturing the thin film transistor shown in FIG. 1.

In an embodiment, the step of forming the thin film transistor on the substrate 20 further comprises steps of: forming the gate electrode 11 on the substrate 20, which is for example made of glass, transparent resin or quartz material, as shown in FIG. 2a; forming a gate insulation layer 12 on the substrate 20 formed with the gate electrode 11, as shown in FIG. 2a, wherein the gate insulation layer 12 may be formed from an oxide, nitride or oxynitride, for example, $SiO_2$ or $SiN_x$; and forming the source electrode 13 and the drain electrode 14 on the gate insulation layer 12.

Figure 2B:
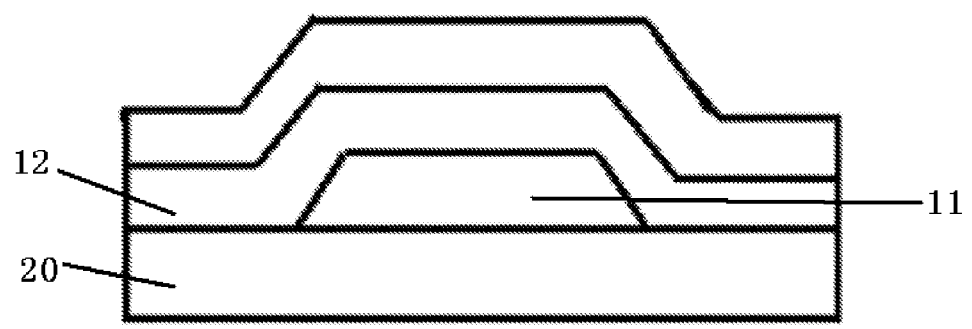
Figure 2C:
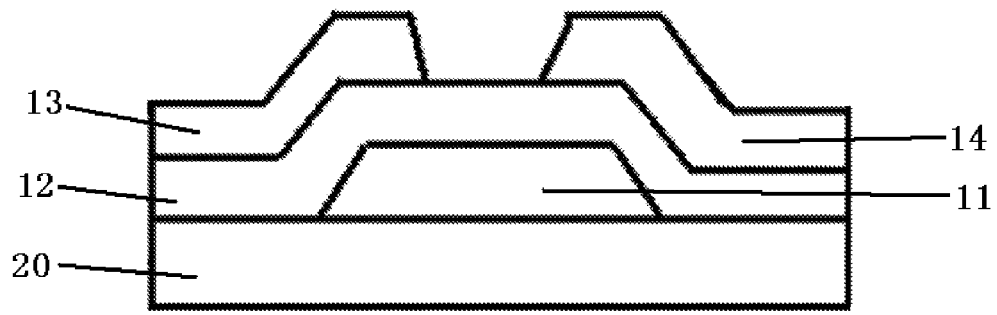

For example, as shown in FIG. 2b, an electrically conductive layer made from a metal, such as Cu, Cr, W, Ti, Ta, Mo, Al or the like, or an alloy thereof is formed on the gate insulation layer 12; then, as shown in FIG. 2c, the source electrode 13 and the drain electrode 14 are prepared by performing a patterning process, for example comprising photoresist coating, exposing, developing, etching or the like, to the electrically conductive layer; then, the aluminum oxide ($Al_2O_3$) material is deposited on the source electrode 13 and the drain electrode 14 to form the first passivation layer 15.

Figure 2D:
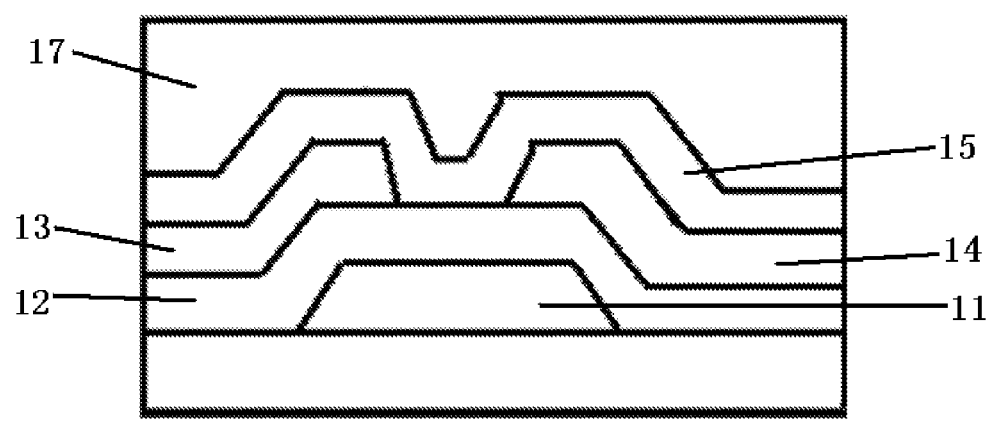

In an embodiment, the step of forming the active layer 16 by doping the first passivation layer 15 with the gallium ions and the tin ions in the region of the first passivation layer 15 corresponding to the gate electrode of the thin film transistor comprises steps of: forming a second passivation layer 17 on the first passivation layer 15, for example, by depositing SiN$_x$ or silicon oxide (SiO$_2$) through a CVD depositing method, as shown in FIG. 2d; and implanting the gallium ions and the tin ions into the region of the first passivation layer 15 corresponding to the gate electrode 11 through the second passivation layer 17 by means of an ion implanting process, so as to perform an ion doping process to the region of the first passivation layer 15 to form the active layer 16.

Figure 2E:
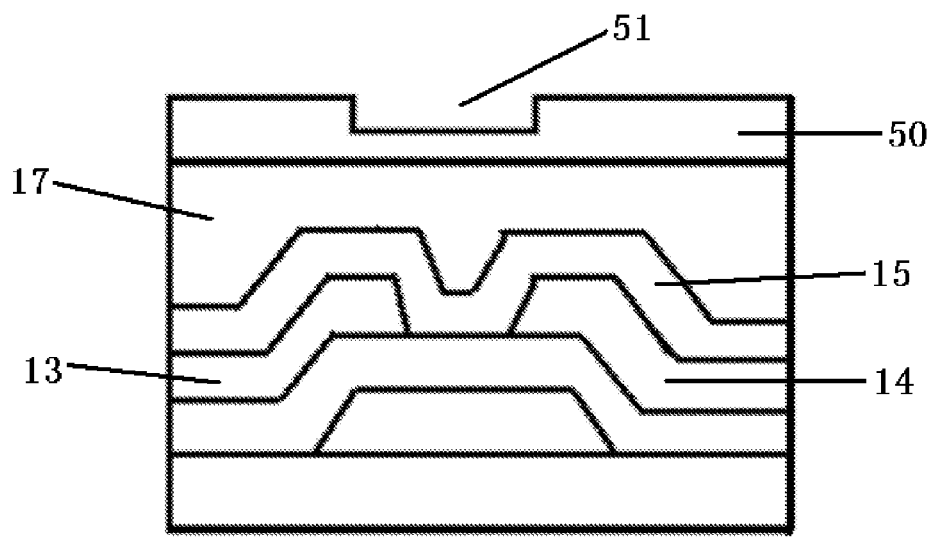
Figure 2F:
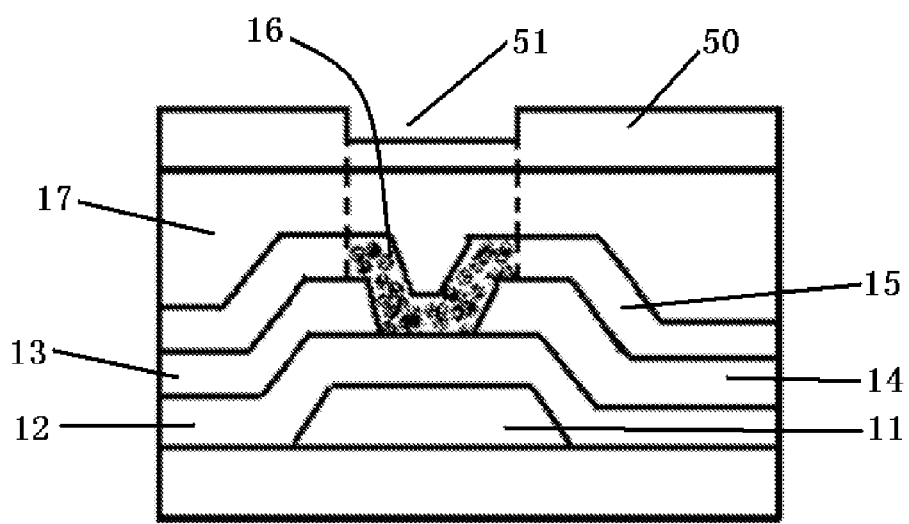

In an embodiment, the step of forming the active layer 16 by doping the first passivation layer 15 with the gallium ions and the tin ions in the region of the first passivation layer 15 corresponding to the gate electrode 11 of the thin film transistor further comprises a step of: forming a photoresist layer 50 on the second passivation layer 17 (as shown in FIG. 2e), so as to implant the gallium ions (Ga$^{3+}$) and the tin ions (Sn$^{2+}$) through the photoresist layer 50 and the second passivation layer 17, as shown in FIG. 2f.

In particular, as shown in FIG. 2e, the photoresist layer 50 is formed on the second passivation layer 17, and the photoresist layer 50 is partially exposed and developed by using a half-tone mask or a gray-tone mask, so as to form a photoresist-partially-retained portion 51 in a position corresponding to the gate electrode 11; then, as shown in FIG. 2f, a part of the first passivation layer 15 corresponding to the photoresist-partially-retained portion 51 is doped with the gallium ions and the tin ions through the photoresist layer 50 and the second passivation layer 17 by an ion implanting process. As a result, the first passivation layer 15 having an insulating property in the doped region is converted into a semiconductor metal oxide, i.e., aluminum-gallium-tin-oxide (AGTO), so that the doped region is formed as the active layer 16. Thereafter, the photoresist layer 50 is removed to finally form the thin film transistor as shown in FIG. 1.

According to the method for manufacturing the thin film transistor in accordance with the present disclosure, after the source electrode 13 and the drain electrode 14 are formed, the first passivation layer 15 covering the source electrode 13 and the drain electrode 14 is doped with the ions so that the first passivation layer 15 having the insulating property is converted into a semiconductor metal oxide, thus the doped region is formed as the active layer 16. Two sides of the active layer 16 are formed to cover edges of respective sides of the source electrode 13 and the drain electrode 14 away from the gate electrode 11, respectively. Thus, during the manufacturing process of the thin film transistor, the process for manufacturing the source electrode 13 and the drain electrode 14 is performed before the process for manufacturing the active layer 16, so that the active layer 16 is not adversely affected due to the patterning process for forming the source electrode 13 and the drain electrode 14. As a result, there is no need to provide an etching stop layer between the active layer and the source electrode and the drain electrode, thereby the structure and the manufacturing process of the thin film transistor are simplified.

According to a further aspect of the present disclosure, as shown in FIGS. 3, 4 and 5a-5h, there is provided a method for manufacturing a pixel structure, comprising a step of forming a switching thin film transistor 10 and a driving thin film transistor 30 on a substrate 20. The step of forming the switching thin film transistor 10 and the driving thin film transistor 30 on the substrate 20 comprises steps of: forming a first passivation layer 15 from an aluminum oxide material on source electrodes and drain electrodes of both the switching thin film transistor 10 and the driving thin film transistor 30; and forming an active layer 16 of the switching thin film transistor 10 and an active layer (not shown) of the driving thin film transistor 30 by doping the first passivation layer 15 with gallium ions (Ga$^{3+}$) and tin ions (Sn$^{2+}$) in regions of the first passivation layer 15 corresponding to both a gate electrode 11 of the switching thin film transistor 10 and a gate electrode 31 of the driving thin film transistor 30, respectively.

According to the method for manufacturing the pixel structure in accordance with the embodiment of the present disclosure, since the first passivation layer as insulation material is doped with the ions to form the active layer, the etching stop layer for respective thin film transistors may be omitted, thereby simplifying the structure of the thin film transistors. The switching thin film transistor 10 and the driving thin film transistor 30 may be arranged in the same layer, so that the switching thin film transistor 10 and the driving thin film transistor 30 form a coplanar structure, thereby facilitating the preparation of a high-resolution display back plate.

Figure 5A:
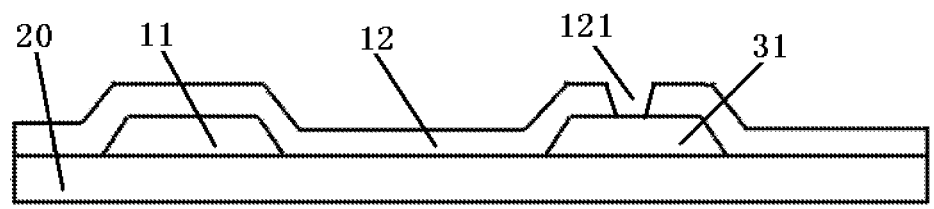
FIGS. 5a-5h are schematic views showing various operating processes for manufacturing the pixel structure shown in FIG. 4.
Figure 5B:
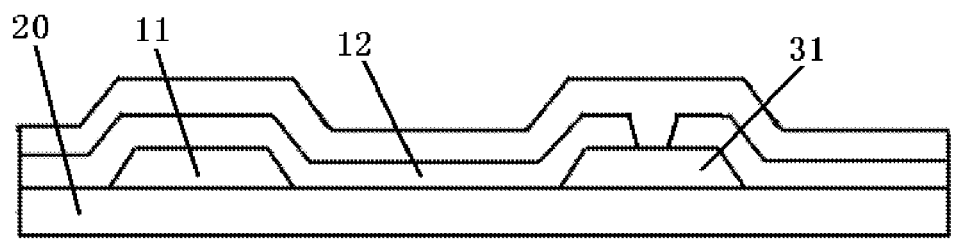
Figure 5C:
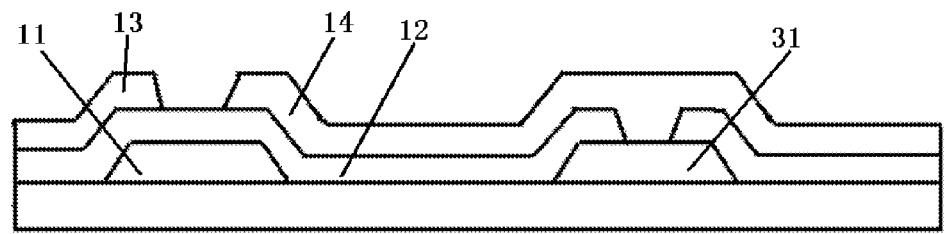

In an embodiment, the step of forming the switching thin film transistor 10 and the driving thin film transistor 30 on the substrate 20 further comprises steps of:

first, forming the gate electrode 11 of the switching thin film transistor 10 and the gate electrode 31 of the driving thin film transistor on the substrate, which is for example made of glass, transparent resin or quartz material, as shown in FIG. 5a;

forming a gate insulation layer 12 on the substrate 20 formed with the gate electrodes 11, 31, wherein the gate insulation layer 12 may be formed from an oxide, nitride or oxynitride, for example, SiO$_2$ or SiN$_x$; and next, forming a first via hole 121 in a position of the gate insulation layer 12 corresponding to the gate electrode 31 of the driving thin film transistor 30, as shown in FIG. 5a;

next, forming an electrically conductive layer on the gate insulation layer 12, the electrically conductive layer being made from a metal, such as Cu, Cr, W, Ti, Ta, Mo, Al or the like, or an alloy material thereof, as shown in FIG. 5b, and the electrically conductive layer being electrically connected to the gate electrode 31 through the first via hole 121; next, forming the source electrode 13 and the drain electrode 14 of the switching thin film transistor 10 and the source electrode and the drain electrode (not shown) of the driving thin film transistor 30 by patterning the electrically conductive layer, with the drain electrode 14 of the switching thin film transistor being electrically connected to the gate electrode 31 of the driving thin film transistor through the first via hole 121, as shown in FIG. 5c.

In this way, the source electrodes and the drain electrodes of both thin film transistors may be formed through one patterning process, thereby reducing the number of the patterning processes and reducing the number of the used masks.

Figure 5D:
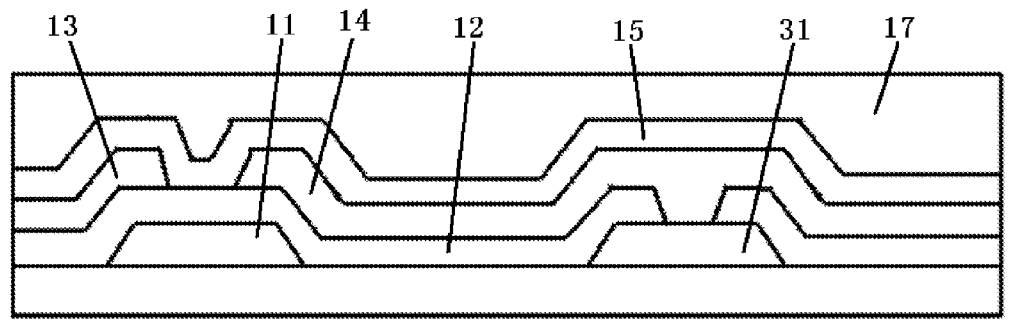

According to an embodiment of the present disclosure, the step of forming the active layer 16 of the switching thin film transistor and the active layer (not shown) of the driving thin film transistor by doping the first passivation layer 15 with the gallium ions and the tin ions in the regions of the first passivation layer 15 corresponding to the gate electrode 11 of the switching thin film transistor and the gate electrode 31 of the driving thin film transistor respectively comprises steps of: forming a second passivation layer 17 on the first passivation layer 15, for example by depositing SiN$_x$ or silicon oxide (SiO$_2$) through a CVD depositing method, as shown in FIG. 5d; and implanting the gallium ions and the tin ions into the regions of the first passivation layer 15 corresponding to the respective gate electrodes 11, 31 through the second passivation layer 17, respectively, so as to perform an ion doping process to the regions of the first passivation layer 15, thereby forming the active layer 16 of the switching thin film transistor and the active layer (not shown) of the driving thin film transistor.

Figure 5E:
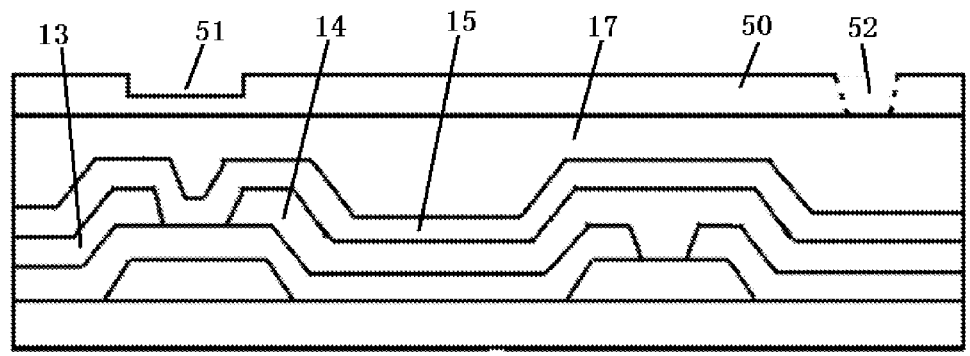
Figure 5F:
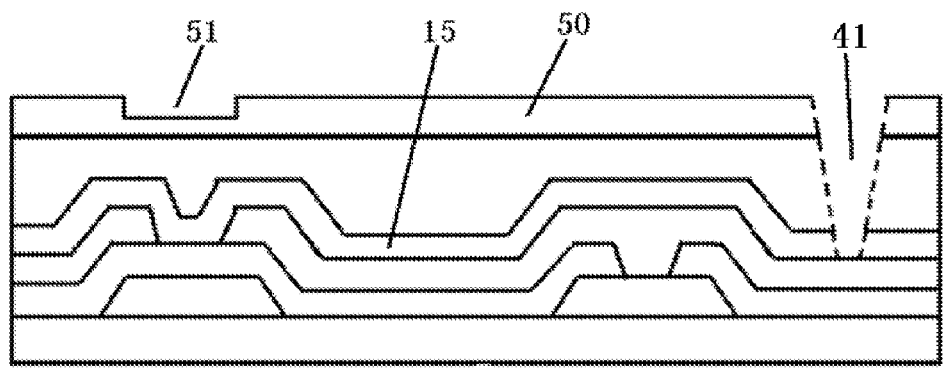
Figure 5G:
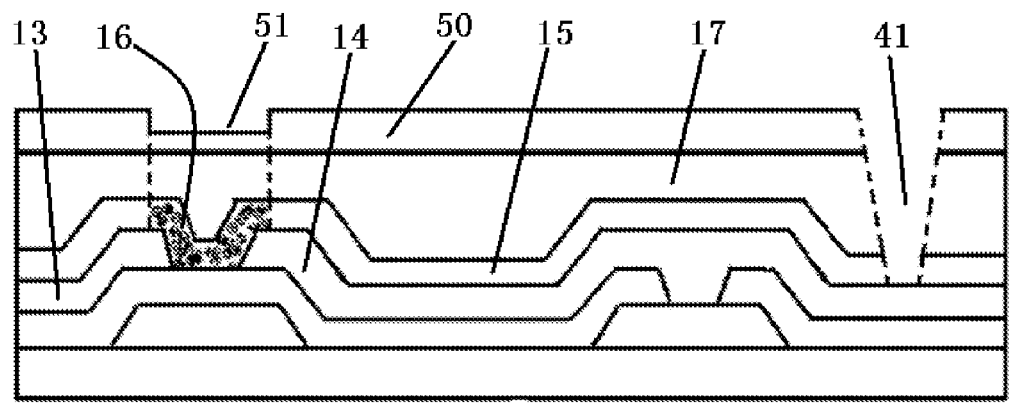
Figure 5H:
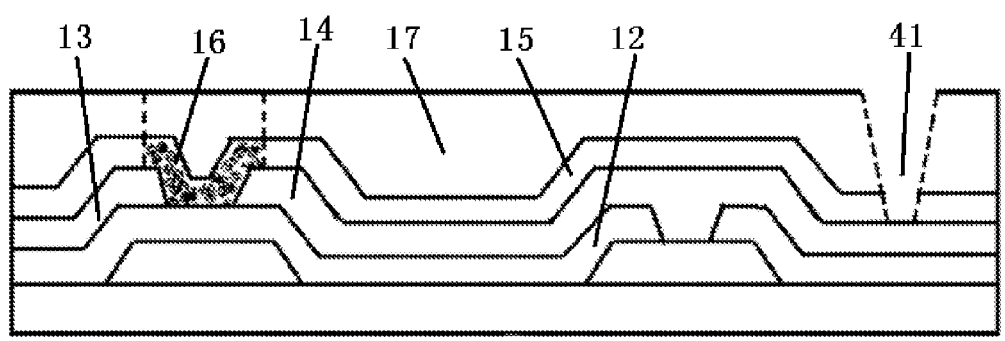

In an embodiment, the step of forming the active layer of the switching thin film transistor and the active layer of the driving thin film transistor by doping the first passivation layer 15 with the gallium ions and the tin ions in the regions of the first passivation layer 15 corresponding to the gate electrode 11 of the switching thin film transistor and the gate electrode 31 of the driving thin film transistor respectively further comprises steps of:

first, forming a photoresist layer 50 on the second passivation layer 17, as shown in FIG. 5e; partially exposing regions of the photoresist layer 50 corresponding to the respective gate electrodes 11, 31 by using a half-tone mask or a gray-tone mask (not shown), and fully exposing a region of the photoresist layer 50 corresponding to the drain electrode (not shown) of the driving thin film transistor, so as to form photoresist-partially-retained portions 51 in positions corresponding to the gate electrodes (in the figure, the photoresist-partially-retained portion corresponding to the gate electrode 31 is not shown) and form a photoresist-fully-removed portion 52 in a position corresponding to the drain electrode of the driving thin film transistor.

then, as shown in FIG. 5f, forming a second via hole 41 by a dry etching process in the photoresist-fully-removed portion 52 of the photoresist layer 50, the second via hole being configured to reach the drain electrode of the driving thin film transistor;

then, as shown in FIG. 5g, implanting the gallium ions and the tin ions by an ion implanting process on the photoresist-partially-retained portion, in the regions of the first passivation layer 15 corresponding to the gate electrode 11 of the switching thin film transistor and the gate electrode 31 of the driving thin film transistor through the photoresist layer having a partial thickness and the second passivation layer 17, thus, the first passivation layer 15 having an insulating property in the doped region is converted into a semiconductor metal oxide, i.e., aluminum-gallium-tin-oxide (AGTO), thereby the doped regions are formed as the active layer 16 of the switching thin film transistor and the active layer (not shown) of the driving thin film transistor.

then, as shown in FIG. 5h, stripping the remaining photoresist; and finally, forming a pixel electrode 40 on the second passivation layer 17 to finally form the pixel structure shown in FIG. 4, the pixel electrode being electrically connected to the drain electrode of the driving thin film transistor through the second via hole 41.

According to the method for manufacturing the pixel structure in accordance with the present disclosure, the first passivation layer covering the source electrodes and the drain electrodes is doped with the ions after the source electrodes and the drain electrodes are formed, thus, the first passivation layer having the insulating property is converted into a semiconductor metal oxide, thereby the doped regions are formed as the active layers. Two sides of each active layer are formed to cover edges of respective sides of the source electrode and the drain electrode away from the corresponding gate electrode, respectively. Thus, during the manufacturing process of the thin film transistor, the process for manufacturing the source electrodes and the drain electrodes is performed before the process for manufacturing the active layers, so that the active layers are not adversely affected due to the patterning process for forming the source electrodes and the drain electrodes. As a result, there is no need to provide an etching stop layer between the active layers and the source electrodes and the drain electrodes, thereby the structure and the manufacturing process of the thin film transistor are simplified. Furthermore, the active layers are not formed by a patterning process, thereby further reducing the number of the used masks, and improving the product yield.

In an embodiment according to a further aspect of the present disclosure, there is provided a method for manufacturing an array substrate, comprising the method for manufacturing the pixel structure according to the embodiments described above.

In an exemplary embodiment, the source electrode and the drain electrode of the thin film transistor may be made from graphene or silver nanowire by an inkjet printing process. The grapheme or silver nanowire has good light transmittance and excellent electrical conductivity. In particular, the grapheme or silver nanowire may be formed into nano-scale fine particles, and may be mixed with a solvent such as deionized water, alcohol or the like, to form nano conductive ink, thereby the inkjet printing process may be adopted to form a conductive wire having a very small width. Thus, it may reduce the size of the thin film transistor, increase the size of the display region, thereby increasing the aperture ratio of the array substrate. In addition, the gate electrode of the thin film transistor may also be made from graphene or silver nanowire by the inkjet printing process.

According to the thin film transistor, the pixel structure, the array substrate, the display device, the method for manufacturing the thin film transistor, the method for manufacturing the pixel structure in accordance with the above-described embodiments of the present disclosure, the switching thin film transistor and the driving thin film transistor may form a coplanar structure, thereby facilitating the preparation of a high-resolution display back plate. Since the first passivation layer as insulation material is doped with the ions to form an active layer, the manufacturing process of the thin film transistor is simplified, the etching stop layer may be omitted, thereby simplifying the structure and the manufacturing process of the thin film transistor.

The objectives, technical solutions, and advantageous effects of the present disclosure are further described in detail with reference to the above-described embodiments, it should be understood that the above embodiments are merely exemplary embodiments, but not intended to limit the present disclosure. Various modifications, substitutions and improvements without departing from the spirit and scope of the present disclosure fall into the scope of the present disclosure.

What is claimed is:

1. A thin film transistor, comprising a gate electrode, a source electrode and a drain electrode, wherein a first passivation layer made from an aluminum oxide material is provided on the source electrode and the drain electrode, and an active layer made from an aluminum oxide material doped with ions is provided in a region of the first passivation layer corresponding to the gate electrode.

2. The thin film transistor according to claim 1, wherein the ions comprise gallium ions and tin ions so that the doped aluminum oxide material forms an aluminum-gallium-tin oxide.

3. The thin film transistor according to claim 1, wherein the thin film transistor is a bottom gate thin film transistor, and two sides of the active layer cover edges of respective sides of the source electrode and the drain electrode away from the gate electrode, respectively.

4. The thin film transistor according to claim 1, wherein a second passivation layer is provided on the first passivation layer.

5. A pixel structure, comprising:
a substrate;
a driving thin film transistor provided on the substrate, the driving thin film transistor being the thin film transistor according to claim 1; and
a switching thin film transistor provided on the substrate, the switching thin film transistor being the thin film transistor according to claim 1,
wherein the drain electrode of the switching thin film transistor is electrically connected to the gate electrode of the driving thin film transistor.

6. The pixel structure according to claim 5, wherein the source electrode and the drain electrode of the switching thin film transistor and the source electrode and the drain electrode of the driving thin film transistor are made of the same material and provided in the same layer.

7. The pixel structure according to claim 5, wherein a second passivation layer is provided on the first passivation layer.

8. The pixel structure according to claim 7, further comprising a pixel electrode electrically connected to the drain electrode of the driving thin film transistor through a via hole formed in the first passivation layer and the second passivation layer.

9. An array substrate, comprising a plurality of pixel structures according to claim 5.

10. A display device, comprising the array substrate according to claim 9.

11. A method for manufacturing a thin film transistor, comprising a step of forming a thin film transistor on a substrate, wherein the step of forming the thin film transistor on the substrate comprises steps of:
forming a first passivation layer from an aluminum oxide material on a source electrode and a drain electrode of the thin film transistor; and
forming an active layer by doping with ions on a region of the first passivation layer corresponding to a gate electrode of the thin film transistor.

12. The method according to claim 11, wherein the step of forming the thin film transistor on the substrate further comprises steps of:
forming the gate electrode on the substrate;
forming a gate insulation layer on the substrate formed with the gate electrode; and
forming the source electrode and the drain electrode on the gate insulation layer.

13. The method according to claim 11, wherein the step of forming the active layer by doping with the ions on the region of the first passivation layer corresponding to the gate electrode of the thin film transistor comprises steps of:
forming a second passivation layer on the first passivation layer; and
implanting gallium ions and tin ions into the region of the first passivation layer corresponding to the gate electrode through the second passivation layer.

14. The method according to claim 13, wherein the step of forming the active layer by doping with the ions on the region of the first passivation layer corresponding to the gate electrode of the thin film transistor further comprises a step of:
forming a photoresist layer on the second passivation layer, so as to implant the gallium ions and the tin ions through the photoresist layer and the second passivation layer.

15. The method according to claim 11, wherein two sides of the active layer are formed to cover edges of respective sides of the source electrode and the drain electrode away from the gate electrode, respectively.

16. A method for manufacturing a pixel structure, comprising a step of forming a switching thin film transistor and a driving thin film transistor on a substrate, wherein the step of forming the switching thin film transistor and the driving thin film transistor on the substrate comprises steps of:
forming a first passivation layer from an aluminum oxide material on source electrodes and drain electrodes of the switching thin film transistor and the driving thin film transistor; and
forming active layers of the switching thin film transistor and the driving thin film transistor by doping with ions on regions of the first passivation layer corresponding to respective gate electrodes of the switching thin film transistor and the driving thin film transistor, respectively.

17. The method according to claim 16, wherein the step of forming the switching thin film transistor and the driving thin film transistor on the substrate further comprises steps of:
forming the gate electrodes of the switching thin film transistor and the driving thin film transistor on the substrate;
forming a gate insulation layer on the substrate formed with the gate electrodes, and forming a first via hole in a position of the gate insulation layer corresponding to the gate electrode of the driving thin film transistor;
forming an electrically conductive layer on the gate insulation layer; and
forming the source electrodes and the drain electrodes of the switching thin film transistor and the driving thin film transistor by means of the electrically conductive layer by a patterning process, respectively, wherein the drain electrode of the switching thin film transistor is electrically connected to the gate electrode of the driving thin film transistor through the first via hole.

18. The method according to claim 16, wherein the step of forming the active layers of the switching thin film transistor and the driving thin film transistor by doping with the ions on the regions of the first passivation layer corresponding to the respective gate electrodes of the switching thin film transistor and the driving thin film transistor respectively comprises steps of:
forming a second passivation layer on the first passivation layer; and
implanting gallium ions and tin ions into the regions of the first passivation layer corresponding to the respective gate electrodes of the switching thin film transistor and the driving thin film transistor through the second passivation layer, respectively.

19. The method according to claim 18, wherein the step of forming the active layers of the switching thin film transistor and the driving thin film transistor by doping with the ions on the regions of the first passivation layer corresponding to the respective gate electrodes of the switching thin film transistor and the driving thin film transistor respectively further comprises steps of:
forming a photoresist layer on the second passivation layer;
partially exposing regions of the photoresist layer corresponding to the respective gate electrodes of the switching thin film transistor and the driving thin film transistor by using a half-tone mask or a gray-tone mask, and fully exposing a region of the photoresist layer corresponding to the drain electrode of the driving thin film transistor;

forming a second via hole by etching in a portion of the photoresist layer where the photoresist has been completely removed, the second via hole being configured to reach the drain electrode of the driving thin film transistor;

implanting the gallium ions and the tin ions in the regions of the first passivation layer corresponding to the respective gate electrodes of the switching thin film transistor and the driving thin film transistor through the photoresist layer and the second passivation layer;

stripping the remaining photoresist; and forming a pixel electrode on the second passivation layer, the pixel electrode being electrically connected to the drain electrode of the driving thin film transistor through the second via hole.

20. The method according to claim 16, wherein two sides of each active layer are formed to cover edges of respective sides of the source electrode and the drain electrode away from the corresponding gate electrode, respectively.

* * * * *